(12) United States Patent
Sun (10) Patent No.: US 7,348,945 B2
(45) Date of Patent: Mar. 25, 2008

(54) ELECTRO-LUMINESCENT DISPLAY PANEL AND DIGITAL-ANALOGY CONVERTER OF THE SAME

(75) Inventor: Wein-Town Sun, Taoyuan (TW)

(73) Assignee: Au Optronics Corp., Hsin-Chu (TW)

( * ) Notice: Subject to any disclaimer, the term of this patent is extended or adjusted under 35 U.S.C. 154(b) by 47 days.

(21) Appl. No.: 11/189,762

(22) Filed: Jul. 27, 2005

(65) Prior Publication Data
US 2006/0145984 A1    Jul. 6, 2006

(30) Foreign Application Priority Data
Dec. 30, 2004    (TW) ............... 93141541 A (51) Int. Cl.
G09G 3/30    (2006.01)
(52) U.S. Cl. ............... 345/76; 345/89; 345/82; 315/169.3
(58) Field of Classification Search ............... 345/76, 345/77, 205, 206, 87, 92, 204, 82, 89; 315/169.1–169.3, 315/169.4; 438/151, 158; 257/57
See application file for complete search history.

(56) References Cited

U.S. PATENT DOCUMENTS

| 5,369,338 | A | * | 11/1994 | Kim ............... 315/169.4 |
| 5,942,856 | A | * | 8/1999 | Koyama ............... 315/169.3 |
| 6,256,024 | B1 | | 7/2001 | Maekawa |
| 6,562,669 | B2 | * | 5/2003 | Suzawa et al. ............... 438/158 |
| 6,586,766 | B2 | * | 7/2003 | Yamazaki et al. ............... 257/57 |
| 6,778,154 | B2 | * | 8/2004 | Van Velzen ............... 345/76 |
| 6,825,071 | B2 | * | 11/2004 | Suzawa et al. ............... 438/158 |
| 6,958,651 | B2 | * | 10/2005 | Kimura ............... 330/253 |
| 7,164,153 | B2 | * | 1/2007 | Lee et al. ............... 257/72 |
| 7,184,014 | B2 | * | 2/2007 | Koyama et al. ............... 345/100 |
| 2003/0090402 | A1 | * | 5/2003 | Nagao ............... 341/154 |
| 2004/0252085 | A1 | * | 12/2004 | Miyagawa ............... 345/76 |

FOREIGN PATENT DOCUMENTS

TW    503583 A    9/2002

* cited by examiner

Primary Examiner—Thuy V. Tran
Assistant Examiner—Jimmy Vu
(74) Attorney, Agent, or Firm—Birch, Stewart, Kolasch & Birch, LLP (57) ABSTRACT

A electro-luminescent (EL) display panel includes a substrate, a pixel and a Digital-Analogy Converter (DAC). The substrate includes a first area and a second area. A Thin Film Transistor (TFT) formed in the first area has a first channel doping concentration, and a TFT formed in the second area has a second channel doping concentration. The pixel is disposed in the second area. The DAC includes switch circuits and current sources. Each switch circuit disposed in the second area is selectively turned on according to corresponding grey levels. Each current source disposed in the first area is electrically connected to the corresponding switch circuit and selectively supplying current to generate a pixel current according to conducting states of the corresponding switch circuit. A threshold voltage variation of the TFT formed in the first area is less than that of the TFT formed in the second area.

18 Claims, 6 Drawing Sheets

ELECTRO-LUMINESCENT DISPLAY PANEL AND DIGITAL-ANALOGY CONVERTER OF THE SAME

This application claims the benefit of Taiwan application Serial No. 93141541, filed Dec. 30, 2004, the subject matter of which is incorporated herein by reference.

BACKGROUND OF THE INVENTION

1. Field of the Invention

The invention relates in general to an electro-luminescent (EL) display panel, and more particularly to an EL display panel with Digital-Analogy Converter (DAC).

2. Description of the Related Art

The light emitting luminance of a light emitting diode (LED) pixel is directly proportional to the current flowing through the pixel, so the pixel is usually driven by the current. The LED pixel generates the corresponding luminance according to the pixel currents, which are provided by the drive circuit according to different grey levels. So, the magnitude of the pixel current directly influences the light emitting luminance of the LED pixel. There are many methods for generating the pixel current. Most of the methods utilize the TFT as the current source, set N current sources according to $2^N$ grey levels, and generate N current values, which are $(2^0)I, (2^1)I, (2^2)I, \ldots (2^{N-1})I$, wherein N is a positive integer. During the display process, the corresponding current sources are turned on according to the grey levels, and the currents supplied by the current sources that are turned on are summated and then outputted as the pixel current.

Figure 1:
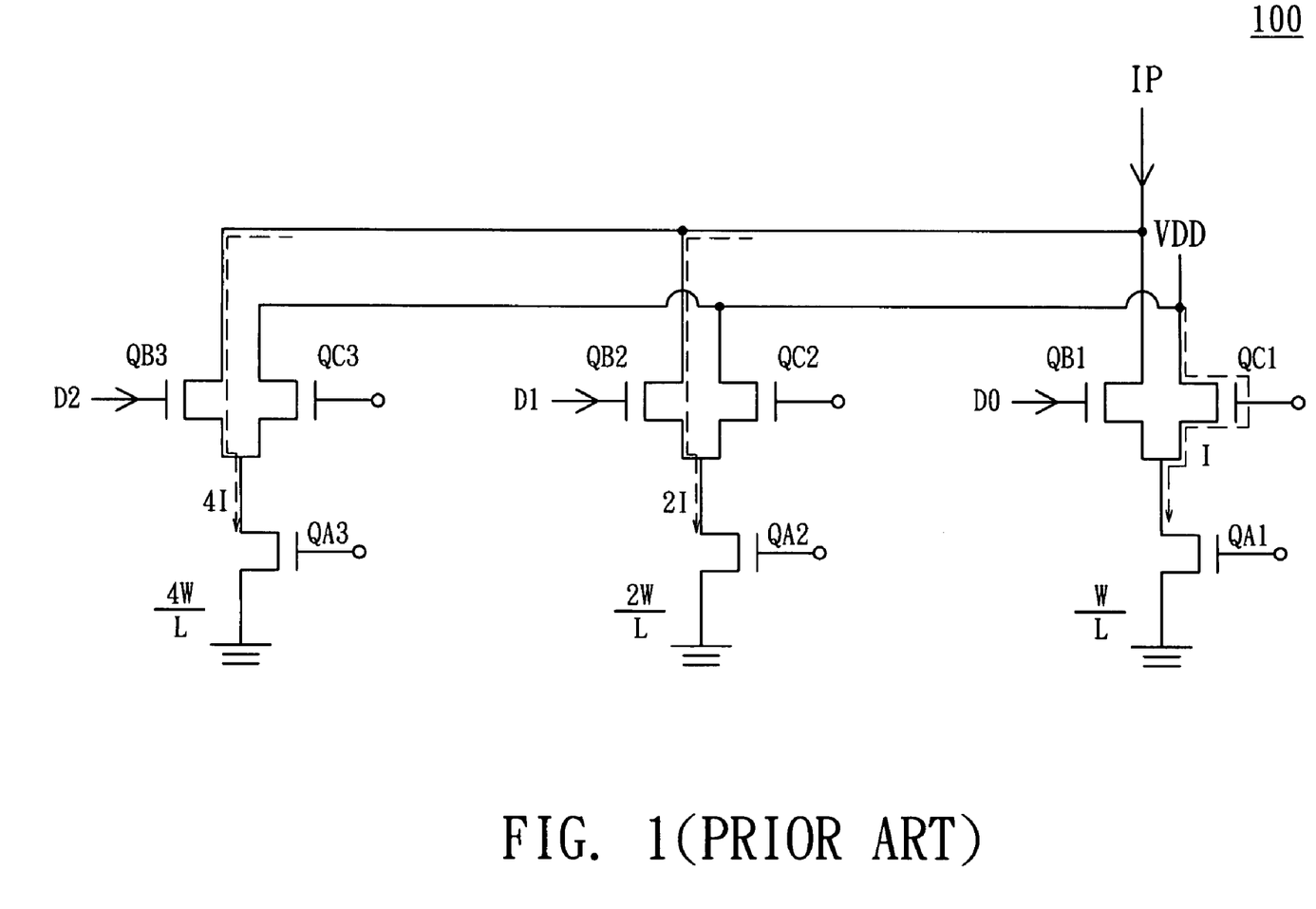
FIG. 1 is a schematic illustration showing a circuit architecture of a conventional DAC.

FIG. 1 is a schematic illustration showing the circuit architecture of a conventional DAC. For example, a DAC 100 for generating eight pixel currents IP includes nine TFTs QA1 to QA3, QB1 to QB3 and QC1 to QC3. The TFTs QA1 to QA3 serving as current sources have ratios (W/L, 2W/L and 4W/L) of channel widths to channel lengths so as to generate currents I, 2I and 4I with different magnitudes.

It is assumed that when the grey level D is data signals (D2 D1 D0)=(110)$_2$, the TFT QB1 is turned off, the current I flows through the TFTs QC1 and QA1 to the ground, and the TFTs QB2 and QB3 are turned on because the data signals D2 and D1 are high. Thus, the currents 2I and 4I serving as the pixel current IP flow through the TFTs QB2, QB3 and QA2, QA3 to the ground, respectively. Hence, the pixel current IP supplied by the DAC 100 is 2I+4I=6I, which is outputted to the corresponding pixel to display the luminance represented by the grey level D=(110)$_2$.

However, the present DAC 100 is usually formed using the low-temperature polysilicon manufacturing processes such that the DAC can be integrated into the display panel of the LED display. The current sources are implemented by the low-temperature polysilicon TFTs QA1 to QA3, or by the circuit composed of the TFTs serving as the architecture. Regardless of the architecture, the TFT manufactured using the low-temperature polysilicon technology may have differences in the threshold voltage variation and the carrier mobility variation owing to the laser crystallization process. Thus, the TFTs such as QA1 to QA3 serving as the current sources may have different threshold voltage variations and carrier mobility variations, the pixel current IP supplied by the DAC 100 differs from the current corresponding to the grey level D, and the predetermined light emitting luminance cannot be reached accordingly.

Figure 2:
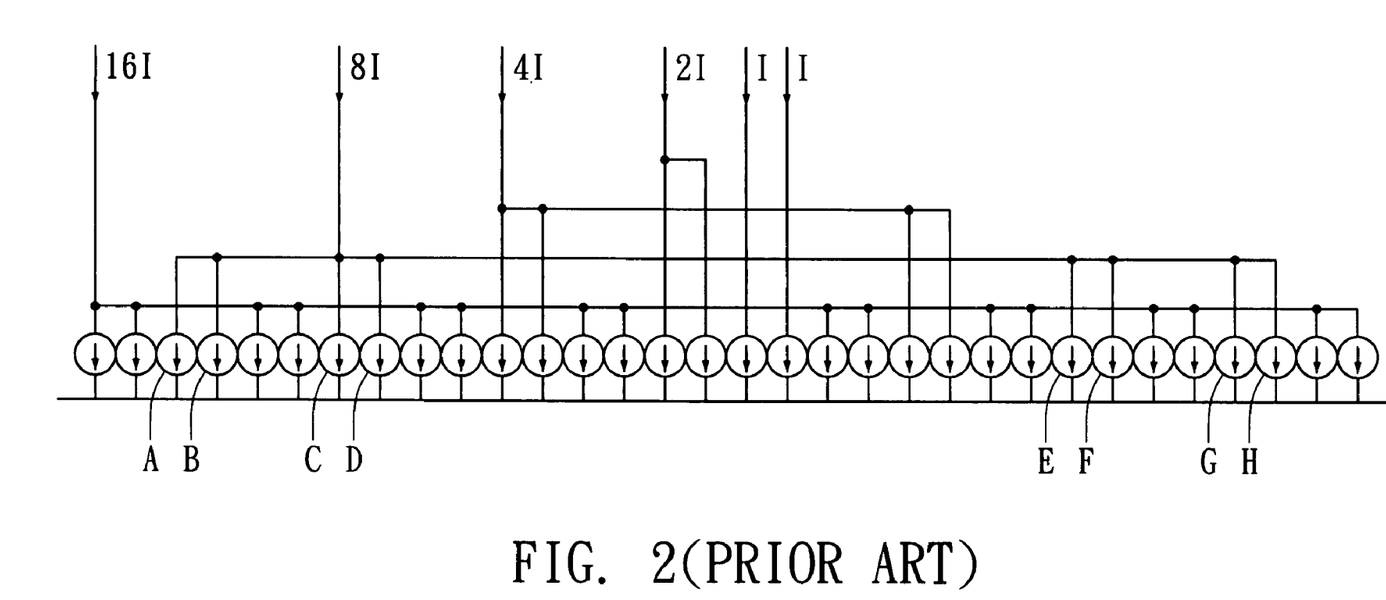
FIG. 2 is a schematic illustration showing the distribution of the conventional current sources.

FIG. 2 is a schematic illustration showing the distribution of the conventional current sources. The conventional solution is to evenly distribute the current sources that generate the currents I, 2I, 4I and 8I. That is, each current source ideally generates a constant current I. For example, two current sources are used to generate the current of 2I, four current sources are used to generate the current of 4I, and eight current sources are used to generate the current of 8I, and so on. The even distribution in the space for reducing the difference between the pixel currents IP will be described in the following. As shown in FIG. 2, the eight current sources are used to generate the current of 8I when the pixel current IP corresponding to the grey level D is 8I, wherein the eight current sources A, B, C, D, E, F, G and H are respectively disposed at the right and left sides. This method, however, greatly enlarges the area of the DAC 100. Thus, it is an important subject of the industry to solve the problem of the uneven frames due to the laser crystallization process, which causes the different threshold voltage variations and carrier mobility variations in the TFTs.

SUMMARY OF THE INVENTION

It is therefore an object of the invention to provide an electro-luminescent (EL) display panel and a digital-analogy converter (DAC) of the same to solve the problem of different threshold voltage variations of thin film transistors (TFT) in the current sources of the DAC, and thus to enhance the image quality.

The invention achieves the above-identified object by providing a DAC used in an EL display panel. The EL display panel includes a substrate and at least one pixel. The substrate has a first area and a second area. The pixel includes a first TFT and an EL device. The first TFT is disposed in the second area for driving the light emitting diode according to a pixel current. The DAC includes several switch circuits disposed in the second area and several current sources disposed in the first area. Each switch circuit has at least one second TFT and selectively turned on according to the corresponding grey level. Each current source has at least one third TFT. Each current source is electrically connected to the corresponding switch circuit, and selectively supplying current to generate the pixel current according to the conducting states of the corresponding switch circuits.

The TFT formed in the first area has a first channel doping concentration. The TFT formed in the second area has a second channel doping concentration. In a low-temperature polysilicon manufacturing process, a first threshold voltage variation of the TFT formed in the first area, is less than a second threshold voltage variation of the TFT formed in the second area.

The invention also achieves the above-identified object by providing an EL display panel, which includes a substrate, a pixel and a DAC. The substrate has a first area and a second area. The pixel includes a first TFT and an EL device. The first TFT disposed in the second area is for driving the EL device according to a pixel current. The DAC supplies the pixel current according to a grey level and includes several switch circuits disposed in the second area and several current sources disposed in the first area. Each switch circuit has at least one second TFT and selectively turned on according to the corresponding grey level. Each current source has at least one third TFT. Each current source is electrically connected to the corresponding switch circuit and selectively supplying currents to generate the pixel current according to conducting states of the corresponding switch circuits.

The TFT formed in the first area has a first channel doping concentration. The TFT formed in the second area has a second channel doping concentration. In a low-temperature polysilicon manufacturing process, a first threshold voltage variation of the TFT formed in the first area, is less than a second threshold voltage variation of the TFT formed in the second area.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 3:
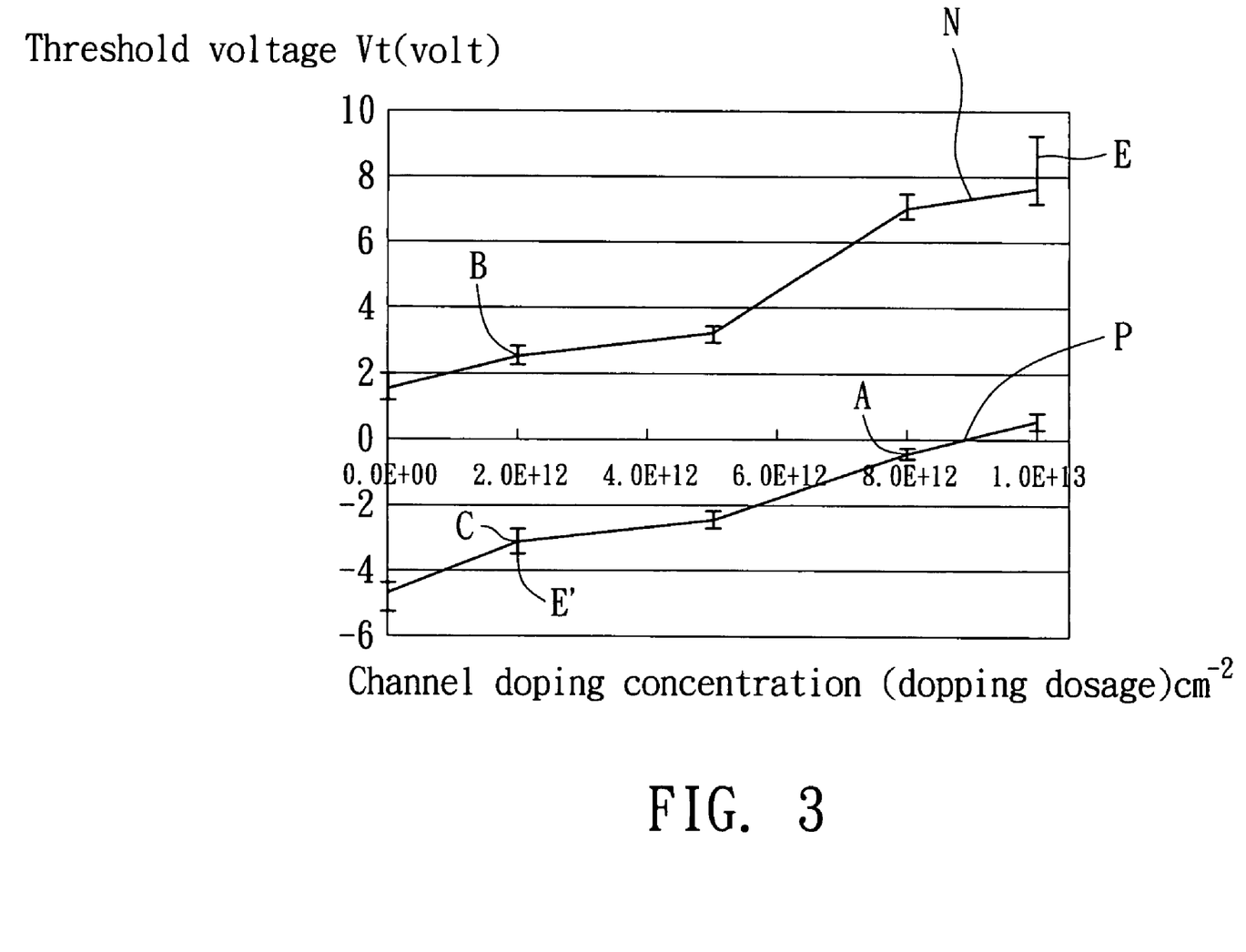
FIG. 3 shows the experimental result of the doping dosage versus the threshold voltage of the low-temperature polysilicon TFT.

During the manufacturing process of the low-temperature polysilicon TFTs, the TFTs manufactured under different channel doping concentrations may have different threshold voltage variations. FIG. 3 shows the experimental result of the doping dosage versus the threshold voltage of the low-temperature polysilicon TFT using the XeCl laser under the condition of energy 350 mJ/cm$^2$. The horizontal axis represents the doping dosage of the channel doping concentration with a unit of cm$^{-2}$. The vertical axis represents the threshold voltage Vt with a unit of volt (voltage). The curve N shows the relationship between the doping dosage of the NMOS and the threshold voltage variation thereof, and the curve P shows the relationship between the doping dosage of the PMOS and the threshold voltage variation thereof. Different channel doping concentrations are formed under different doping dosages such that the TFT has different threshold voltage variations. The error bar E represents the magnitude of the threshold voltage variation. For example, when the doping dosage is 1.0E+13 cm$^{-2}$, the magnitude of the threshold voltage variation of the NMOS corresponds to the length of the error bar E. As the error bar E gets longer, the variation gets lager, which means that the threshold voltage difference of the NMOS gets larger. Thus, the threshold voltage variation of the NMOS reaches the maximum when the doping dosage is 1.0E+13 cm$^{-2}$ in the curve N.

According to this relationship, the TFT manufactured at a channel doping concentration formed at some doping dosage has a minimum threshold voltage variation (i.e., a shortest error bar). For example, the channel doping concentration of the PMOS is changed by doping boron, and the channel doping concentration of the PMOS at the minimum threshold voltage variation is found. For instance, at the point A of FIG. 3, the doping dosage is 8.0E+12 cm$^{-2}$, the threshold voltage variation of the PMOS is the minimum. So, when the TFT manufactured according to the doping dosage 8.0E+12 cm$^{-2}$ serves as a current source, the difference between the ideal current and the current outputted from the current source will be minimized such that the pixel current outputted from the DAC is closer to the ideal current.

Figure 4:
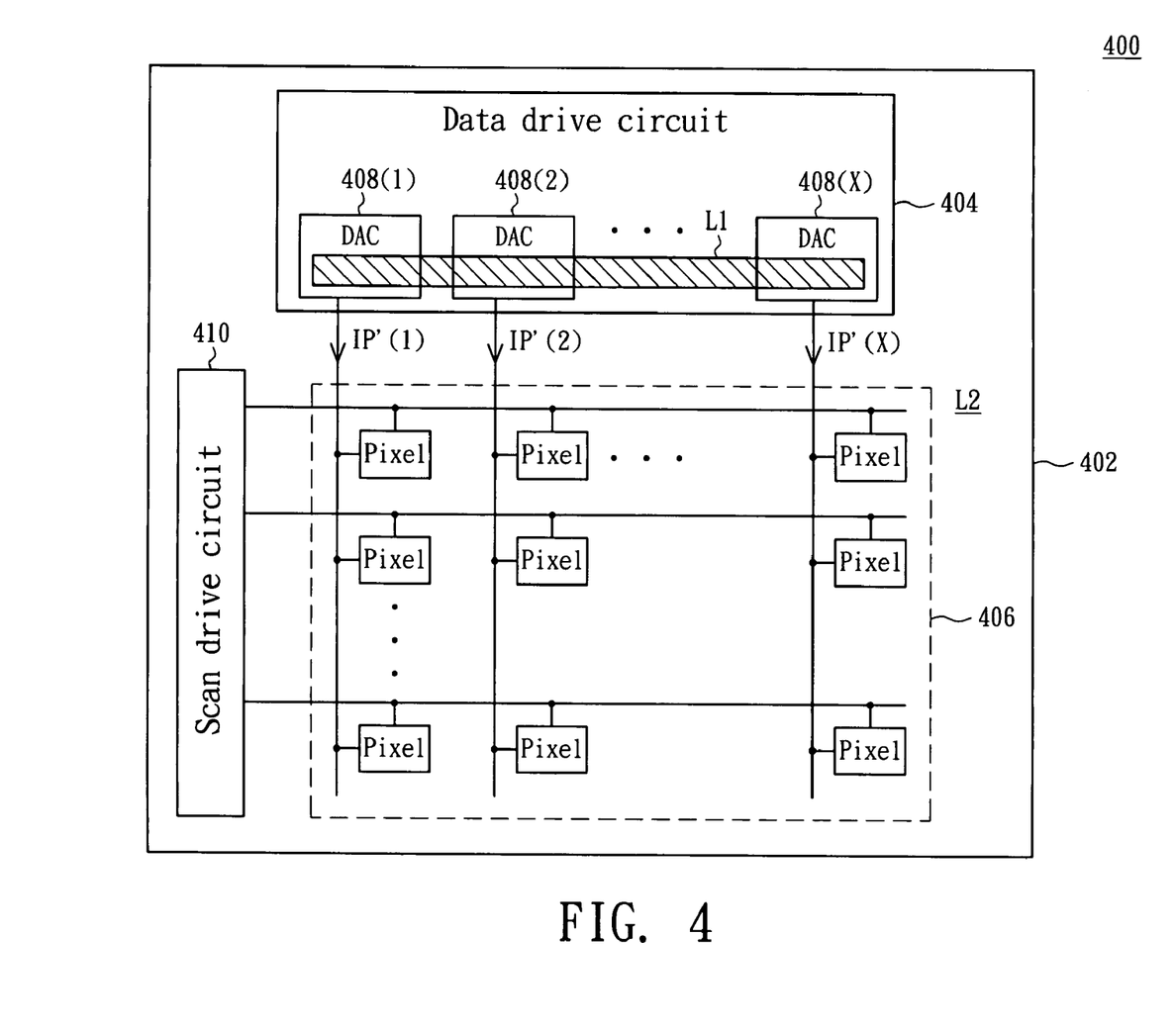
FIG. 4 is a schematic illustration showing an electroluminescent display panel according to a preferred embodiment of the invention.

FIG. 4 is a schematic illustration showing an electroluminescent (EL) display panel according to a preferred embodiment of the invention. The EL display panel, such as a LED display panel 400, includes a substrate 402, a data drive circuit 404, a scan drive circuit 410 and a pixel array 406. The substrate 402 has a first area L1 and a second area L2. The pixel array 406 is composed of several pixels, each of which includes a TFT Q1 and an EL device. The EL device is, for example, an organic light emitting diode or a polymer light emitting diode (the TFT Q1 and the EL device are not shown in FIG. 4). The TFT Q1 drives the EL device according to the pixel current. The TFT Q1 is disposed in the second area L2. The scan drive circuit 410 sequentially outputs scan signals to the pixel array 406 to enable the pixels to receive the corresponding pixel currents IP'(1) to IP'(X), wherein X is a positive integer. The scan drive circuit 410 is disposed in the second area L2.

The data drive circuit 404 outputs the pixel currents IP'(1) to IP'(X) according to grey levels and includes several DACs 408(1) to 408(X). Each of the DACs 408(1) to 408(X) includes several switch circuits and several current sources, all of which are not shown in FIG. 4. Each switch circuit has at least one TFT Q2. Each switch circuit disposed in the second area L2 is selectively turned on according to the corresponding grey level. Each current source has at least one TFT Q3 and is electrically connected to the corresponding switch circuit. Each current source selectively supplies currents to generate the pixel current IP according to the conducting states of the corresponding switch circuit. The current sources are disposed in the first area L1. The TFT, such as the TFT Q3, formed in the first area L1 has a first channel doping concentration, and the TFTs, such as the TFTs Q1 and Q2, formed in the second area L2 have a second channel doping concentration. In a low-temperature polysilicon manufacturing process, a first threshold voltage variation of the TFT Q3 formed in the first area L1, is less than a second threshold voltage variation of the TFTs Q1 and Q2 formed in the second area L2.

In detail, the embodiment differs from the prior art. In the prior art, the whole drive circuit, such as the data drive circuit or the scan drive circuit, and the pixel array are formed on the same substrate with the same channel doping concentration (e.g., the second channel doping concentration). Under the second channel doping concentration, the absolute values of the threshold voltages of the PMOS and NMOS are close to each other in order to facilitate the circuit design. Under the channel doping concentration, however, the threshold voltage variation of the TFT is larger. For instance, when the doping dosage of FIG. 3 is 2.0E+12 cm$^{-2}$, the threshold voltages of the PMOS and the NMOS approach a symmetrical state (as shown in points B and C in FIG. 3). However, the error bar E' of the PMOS is relatively large as compared with those at other doping dosages. Thus, the threshold voltage variation of the PMOS under the doping dosage (2.0E+12 cm$^{-2}$) is larger. In this embodiment, each current source in each DAC 408 is implemented by a TFT (e.g., TFT Q3) having the first channel doping concentration. According to the spirit of the embodiment, the doping dosage which minimizes the threshold voltage variation is found through experiments, and the channel doping concentration formed according to the doping dosage is used as the first channel doping concentration, according to which the TFT Q3 disposed in the first area L1 of the substrate 402 is formed. Consequently, the TFT Q3 having the minimum threshold voltage variation can be obtained such that the component difference between the current sources implemented by the TFTs Q3 is reduced, and the magnitude of the currents generated by the current sources are closer to the ideal values.

Figure 5A:
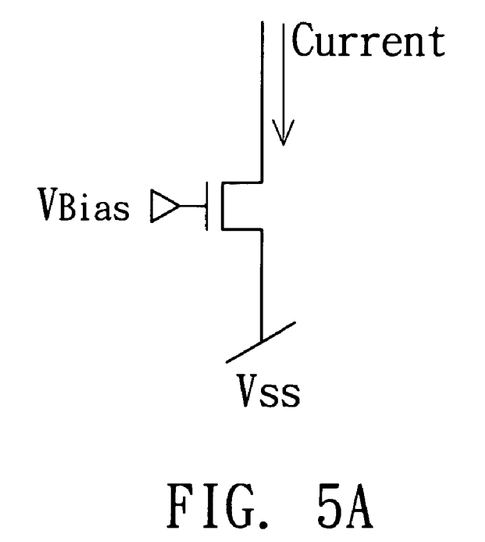
FIG. 5A is a schematic illustration showing an illustrative circuit using a TFT as a current source.
Figure 5B:
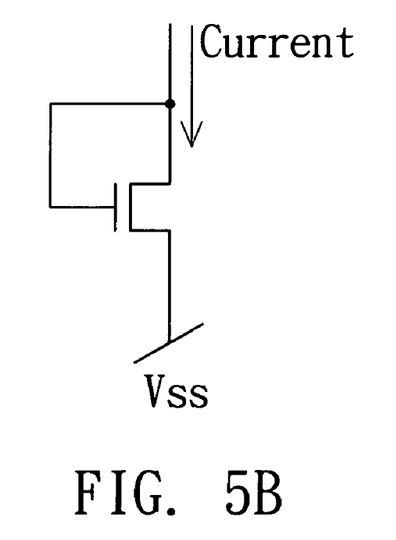
FIG. 5B is a schematic illustration showing another illustrative circuit using a TFT as a current source.

There are many methods for implementing current sources using TFTs. FIG. 5A is a schematic illustration showing an illustrative circuit using a TFT as a current source, and FIG. 5B is a schematic illustration showing another illustrative circuit using a TFT as a current source. As shown in FIGS. 5A and 5B, the magnitude of the current when the TFT Q3 is turned on is set using different W/L ratios such that the TFT Q3 can output the currents $(2^0)I$, $(2^1)I$, ... $(2^{N-1})I$. Alternatively, the current source can be implemented using a current mirror. Thus, no matter which kind of TFT is used to constitute the current source, the TFT Q3 with the first channel doping concentration is always used. Thus, the magnitudes of the currents outputted from the current sources in each DAC 408 may be closer to the ideal values.

Figure 6:
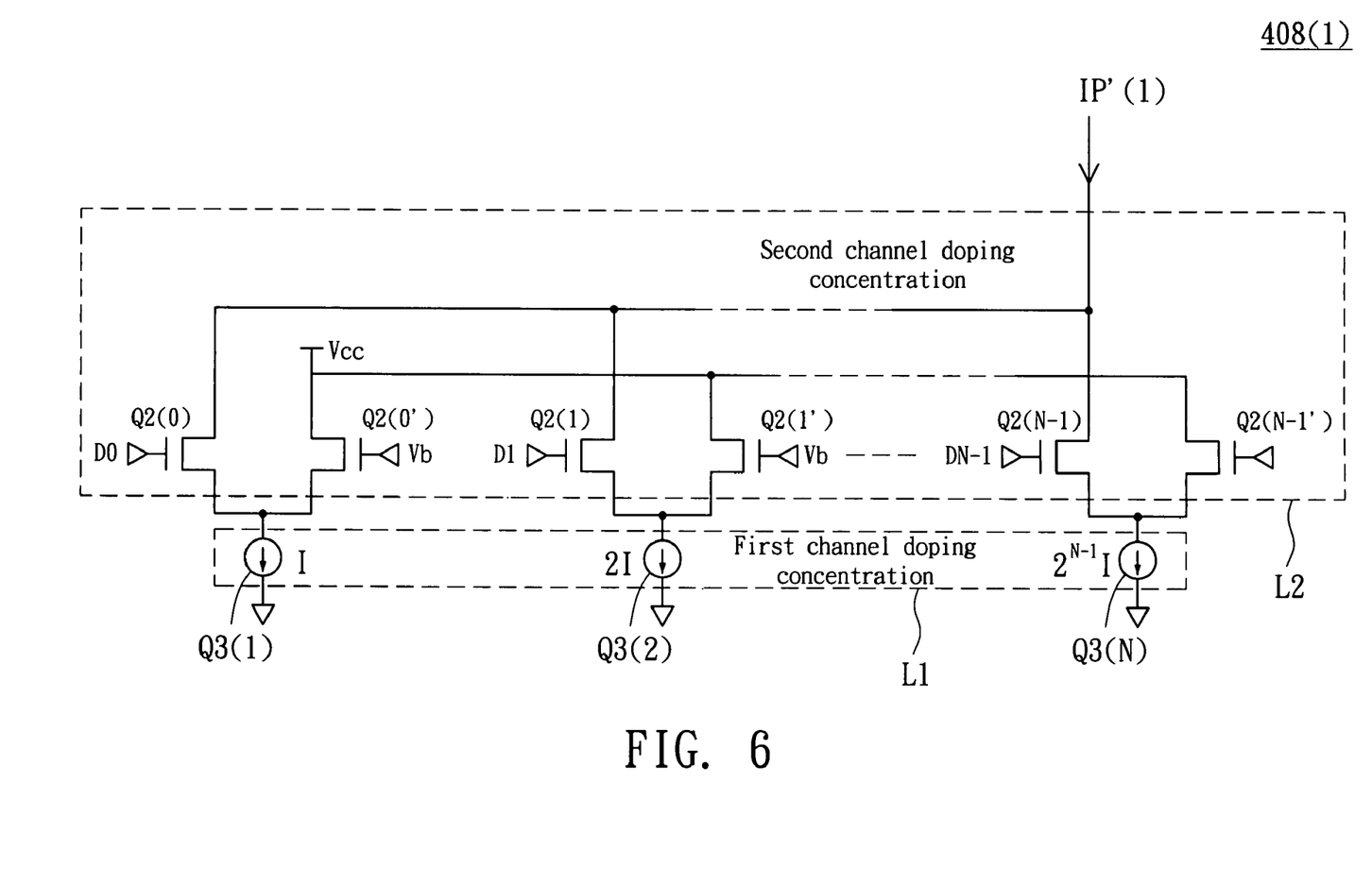
FIG. 6 is a schematic illustration showing an example of the circuit architecture using the DAC 408(1).

FIG. 6 is a schematic illustration showing an example of the circuit architecture using the DAC 408(1). The TFTs Q3(1) to Q3(N) serving as the current sources are disposed in the first area L1. Because the threshold voltage variation is the minimum, the differences between the currents $(2^0)I$, $(2^1)I$, ... $(2^{N-1})$ outputted from each stage of current sources will be greatly reduced. In addition, the switch circuits are implemented by the TFT Q2(0) to Q2(N-1) and Q2(0') to Q2(N-1') and disposed in the second area L2. Thus, the difference between the pixel current IP'(1) generated by the DAC 408(1) and the pixel current IP'(X) generated by the DAC 408(X) gets smaller. When all DACs 408(1) to 408(K) receive the same grey level D, the differences between the pixel currents IP'(1) to IP'(K) outputted from the DACs 408(1) to 408(K) are smaller than those in the prior art, and the pixel currents IP'(1) to IP'(K) are closer to those corresponding to the grey levels D. Thus, the overall frame displays the same luminance and is evener than that of the prior art.

The threshold voltage variation of the TFT does not greatly influence the switch circuits and other circuits, such as the scan drive circuit 410, the pixel array 406 and the data drive circuit 404, which are included in each DAC 408. Thus, other circuits except for the current sources in the data drive circuit 404 are disposed in the second area L2 of the substrate 402. In the second area L2 using the second channel doping concentration, the absolute values of the threshold voltages of the PMOS and the NMOS are close to each other in order to facilitate the circuit design. Alternatively, when the scan drive circuit 410 is to be integrated on the display panel, it may be disposed in the second area L2 of the substrate 402.

In the LED display panel and DAC disclosed according to the embodiment of the invention, the channel doping concentration when the threshold voltage variation is the minimum is found, and the TFT is manufactured according to the channel doping concentration. Thus, the TFT has a minimum threshold voltage variation. In addition, the current sources in the DAC are implemented by TFTs such that the magnitudes of the currents outputted from are closer to the ideal values.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A digital-to-analog converter (DAC), used in an electro-luminescent (EL) display panel, the EL display panel comprising a substrate and at least one pixel, the substrate having a first area and a second area, the at least one pixel comprising a first thin film transistor (TFT) and an EL device, the first TFT being disposed in the second area for driving the EL device according to a pixel current, the DAC comprising:
   a plurality of switch circuits disposed in the second area, each having at least one second TFT, each switch circuit being selectively turned on according to the corresponding grey level; and
   a plurality of current sources disposed in the first area, each having at least one third TFT, each current source being electrically connected to the corresponding switch circuit and selectively supplying current to generate the pixel current according to conducting states of the corresponding switch circuit, wherein
   the TFT formed in the first area has a first channel doping concentration;
   the TFT formed in the second area has a second channel doping concentration; and
   in a low-temperature polysilicon manufacturing process, a first threshold voltage variation of the TFT formed in the first area is less than a second threshold voltage variation of the TFT formed in the second area.

2. The DAC according to claim 1, wherein only the current sources are disposed in the first area.

3. A electro-luminescent (EL) display panel, comprising:
   a substrate having a first area and a second area;
   a pixel comprising an EL device and a first TFT disposed in the second area for driving the EL device according to a pixel current; and
   a DAC for supplying the pixel current according to a grey level, comprising:
      a plurality of switch circuits disposed in the second area, each having at least one second TFT, each switch circuit being selectively turned on according to the corresponding grey level; and
      a plurality of current sources disposed in the first area, each having at least one third TFT, each current source being electrically connected to the corresponding switch circuit and selectively supplying current to generate the pixel current according to conducting states of the corresponding switch circuit, wherein
   the TFT formed in the first area has a first channel doping concentration;
   the TFT formed in the second area has a second channel doping concentration; and
   in a low-temperature polysilicon manufacturing process, a first threshold voltage variation of the TFT formed in the first area is less than a second threshold voltage variation of the TFT formed in the second area.

4. The display panel according to claim 3, wherein only the current sources in the DAC are disposed in the first area.

5. The display panel according to claim 3, further comprising a scan drive circuit disposed in the second area and configured to enable the pixel to receive the pixel current.

6. The display panel according to claim 3, wherein the EL device comprises an organic light emitting diode.

7. The display panel according to claim 3, wherein the EL device comprises a polymer light emitting diode.

8. An EL display panel, comprising:
a substrate having a first area and a second area;
a pixel comprising an EL device and a first TFT disposed in the second area for driving the EL device according to a pixel current;
a scan drive circuit disposed in the second area configured to enable the pixel to receive the pixel current; and
a data drive circuit for supplying the pixel current according to a grey level, the data drive circuit comprising a DAC, which comprises:
a plurality of switch circuits disposed in the second area, each having at least one second TFT, each switch circuit being selectively turned on according to the corresponding grey level; and
a plurality of current sources disposed in the first area, each having at least one third TFT, each current source being electrically connected to the corresponding switch circuit and selectively supplying current to generate the pixel current according to conducting states of the corresponding switch circuit, wherein
a first threshold voltage variation of the TFT formed in the first area, is less than a second threshold voltage variation of the TFT formed in the second area,
wherein the TFTs formed in the first area having a first channel doping concentration, and the TFTs formed in the second area having a second channel doping concentration.

9. An EL display panel, comprising:
a pixel, which comprises an EL device and a first TFT for driving the EL device according to a pixel current;
a plurality of switch circuits, each having a second TFT having a second channel doping concentration, each switch circuit being selectively turned on according to the corresponding grey level; and
a plurality of current sources, each having at least one third TFT having a first channel doping concentration, each current source being electrically connected to the corresponding switch circuit and selectively supplying current to generate the pixel current according to conducting states of the corresponding switch circuit,
wherein the first channel doping concentration is different from the second channel doping concentration.

10. The display panel according to claim 9, wherein a threshold voltage variation of the third TFT is less than a threshold voltage variation of the second TFT.

11. The display panel according to claim 9, wherein the first channel doping concentration is a doping concentration when the threshold voltage variation of the third TFT is a minimum variation.

12. The display panel according to claim 9, wherein each of the second TFT and the third TFT is a low-temperature polysilicon TFT.

13. An EL display panel, comprising:
a plurality of EL device;
a plurality of current sources having a plurality of TFTs having a first channel doping concentration; and
a plurality of switch circuits having a plurality of TFTs having a second channel doping concentration, each current source being electrically connected to the corresponding switch circuit and driving the corresponding EL device according to conducting states of the corresponding switch circuits,
wherein the first channel doping concentration is different from the second channel doping concentration.

14. The display panel according to claim 13, wherein the first channel doping concentration is a doping concentration when a threshold voltage variation of each of the TFTs having the first channel doping concentration is a minimum concentration.

15. The display panel according to claim 13, wherein a threshold voltage variation of each of the TFTs having the first channel doping concentration is less than a threshold voltage variation of each of the TFTs having the second channel doping concentration.

16. The display panel according to claim 13, wherein each of the TFTs having the first channel doping concentration and the TFTs having the second channel doping concentration is a low-temperature polysilicon TFT.

17. The display panel according to claim 13, wherein each of the EL devices is an organic light emitting diode.

18. The display panel according to claim 13, wherein each of the plurality of EL devices is a polymer light emitting diode.

* * * * *